(12) United States Patent
Koifman et al.

(10) Patent No.: US 11,086,017 B2
(45) Date of Patent: Aug. 10, 2021

(54) LIDAR SYSTEM

(71) Applicant: ANALOG VALUE LTD., Rishon Lezion (IL)

(72) Inventors: Vladimir Koifman, Rishon Lezion (IL); Tiberiu Galambos, Binyamina (IL); Anatoli Mordakhay, Hadera (IL)

(73) Assignee: Analog Value Ltd., Herzliya (IL)

( * ) Notice: Subject to any disclaimer, the term of this patent is extended or adjusted under 35 U.S.C. 154(b) by 441 days.

(21) Appl. No.: 16/013,961

(22) Filed: Jun. 21, 2018

(65) Prior Publication Data

US 2018/0372873 A1 Dec. 27, 2018

Related U.S. Application Data (60) Provisional application No. 62/522,727, filed on Jun. 21, 2017.

(51) Int. Cl.
| | | |
|---|---|---|
| G01C 3/08 | (2006.01) | |
| G01S 17/89 | (2020.01) | |
| H01L 27/146 | (2006.01) | |
| G01S 7/484 | (2006.01) | |
| G01S 7/4863 | (2020.01) | |
| G01S 7/481 | (2006.01) | |
| G01S 17/42 | (2006.01) | |
| G01S 17/10 | (2020.01) | |
| G01S 7/487 | (2006.01) | |

(52) U.S. Cl.
CPC .............. *G01S 17/89* (2013.01); *G01S 7/484* (2013.01); *G01S 7/4815* (2013.01); *G01S 7/4863* (2013.01); *G01S 7/4876* (2013.01); *G01S 17/10* (2013.01); *G01S 17/42* (2013.01); *H01L 27/14643* (2013.01)

(58) Field of Classification Search
CPC ...... G01S 7/484; G01S 7/4876; G01S 7/4815; G01S 7/4863; G01S 17/10; G01S 17/42; G01S 17/89; H01L 27/4643
USPC ........................................................ 356/4.01
See application file for complete search history.

(56) References Cited

U.S. PATENT DOCUMENTS

| | | | |
|---|---|---|---|
| 2018/0278868 A1* | 9/2018 | Dawson | G06N 3/0635 |
| 2019/0056498 A1* | 2/2019 | Sonn | G01S 17/89 |

\* cited by examiner

*Primary Examiner* — Mark Hellner
(74) *Attorney, Agent, or Firm* — Reches Patent (57) ABSTRACT

A LIDAR system that may include a transmitter and a receiver. The LIDAR system may include a transmitter and a receiver that may include an array of neuromorphic pixels and multiple accumulators. Each neuromorphic pixel may include multiple subpixels, an analog adder and a comparator; wherein for each reception period the analog adder is configured to generate an analog adder signal by adding detection signals from subpixels that are expected to receive at least one received light pulse during the reception period; wherein for each reception period the analog adder signal is indifferent to subpixels that are not expected to receive any received light pulses during the reception period; and wherein the comparator is configured to provide pixel output signals by comparing the analog adder signal to a threshold. The multiple accumulators are configured to add multiple pixel output signals from neuromorphic pixels to provide, for each neuromorphic pixel, an accumulated signal that represents radiations sensed by the neuromorphic pixel during the multiple reception periods.

18 Claims, 9 Drawing Sheets

LIDAR SYSTEM

CROSS REFERENCE

This application claims priority from U.S. provisional patent 62/522,712 filed Jun. 21, 2017.

BACKGROUND

LIDAR systems are key components in future self-driving automotive applications. The purpose of the system is to create a 3D model of the environment. This is achieved by illuminating the scene with an infrared pulsed laser and measuring the time in which the reflection returns from the different objects (time of flight).

There are various types of LIDAR systems, depending on whether the scene is scanned point by point (scanning LIDAR) or the illumination is applied simultaneously to the whole scene (flash LIDAR) or anything in between (for example scanning with a linear vector).

One of the key limitations of LIDAR is caused by the ambient light that basically acts as noise for the imaging system. In order to overcome this issue, powerful illuminators are used but they have to be designed so as to conform to regulations related to eye safety.

SUMMARY

That may be provided a LIDAR system that may include a transmitter and a receiver. The transmitter may include a pulsed laser illuminator that may be followed by a beam forming optics. The transmitter may be configured to output, during each illumination period of multiple illumination periods, one or more laser pulses that form a sparse pattern. The receiver may be configured to receive, during each reception period of multiple reception periods, one or more received light pulses from one or more objects that were illuminated by the one or more laser pulses transmitted during each illumination period.

The receiver may include an array of neuromorphic pixels and multiple accumulators. Each neuromorphic pixel may include multiple subpixels, an analog adder and a comparator. wherein for each reception period the analog adder may be configured to generate an analog adder signal by adding detection signals from subpixels that may be expected to receive at least one received light pulse during the reception period. wherein for each reception period the analog adder signal may be indifferent to subpixels that may be not expected to receive any received light pulses during the reception period. The comparator may be configured to provide pixel output signals by comparing the analog adder signal to a threshold.

The multiple accumulators may be configured to add multiple pixel output signals from neuromorphic pixels to provide, for each neuromorphic pixel, an accumulated signal that represents radiations sensed by the neuromorphic pixel during the multiple reception periods.

The transmitter may be configured to output, at a certain point in time of each illumination period, the one or more laser pulses that form the sparse pattern.

For each reception period, each neuromorphic pixel may be configured to deactivate the subpixels that may be not expected to receive any received light pulse during the reception period.

For each reception period, the analog adder of each neuromorphic pixel may be configured to ignore signals outputted from subpixels that may be not expected to receive any received light pulse during the reception period.

The transmitter may be configured to output, at different points in time during each illumination period, different laser pulses that form the sparse pattern.

For each reception period and for each point in time of the different points in time, each neuromorphic pixel may be configured to deactivate the subpixels that may be not expected to receive any received light pulse during the point in time of the different points in time.

For each reception period and for each point in time of the different points in time, the analog adder of each neuromorphic pixel may be configured to ignore signals outputted from subpixels that may be not expected to receive any received light pulse during the point in time of the different points in time.

The transmitter may include multiple laser diodes that may be configured to output at different points in time of each illumination period, different laser pulses that form the sparse pattern.

Different laser diodes may be configured to output different parts of the sparse pattern.

The sparse pattern may include multiple lines that may be spaced apart from each other. An aggregate size of the sparse pattern may be a fraction of a field of view of the receiver.

Each subpixel may include a photodiode biased by a non-linear element, and a charge amplifier.

The non-linear element may be a diode connected MOS_FET in sub-threshold region.

The non-linear element may include an auto-zero mechanism that compensates at least one out of device mismatches, circuit mismatches, control signal variation across the pixels and supply variations across the pixels.

The non-linear element may be configured to provide non-zero minimal photo-diode bias current during integration and auto-zero phases of the photo-diode.

Each subpixel may include a photodiode biased by a non-linear element, and a trans conductor amplifier.

The analog adder of each neuromorphic pixel may be configured to (i) generate a positive pulse for a rising portion of each detection signal from each subpixel of the subpixels that may be expected to receive at least one received light pulse during the reception period. and (ii) generate a negative pulse for a falling portion of each detection signal from each subpixel of the subpixels that may be expected to receive at least one received light pulse during the reception period.

There may be provided a method for detecting one or more targets using a LIDAR system, the method may include:
  a. Outputting, by a transmitter of the LIDAR system, during each illumination period of multiple illumination periods, one or more laser pulses that form a sparse pattern. The transmitter may include a pulsed laser illuminator that may be followed by a beam forming optics.
  b. Receiving, by a receiver of the LIDAR system, during each reception period of multiple reception periods, one or more received light pulses from one or more objects that were illuminated by the one or more laser pulses transmitted during each illumination period. The receiver may include an array of neuromorphic pixels and multiple accumulators. wherein each neuromorphic pixel may include multiple subpixels, an analog adder and a comparator.
  c. Generating an analog adder signal, for each reception period and by each analog adder, by adding detection signals from subpixels that may be expected to receive at least one received light pulse during the reception period. wherein for each reception period the analog adder signal may be indifferent to subpixels that may be not expected to receive any received light pulses during the reception period.
  d. Providing pixel output signal, by each comparator and for each reception period, by comparing the analog adder signal to a threshold.
  e. Adding, by multiple accumulators of the LIDAR system, multiple pixel output signals from neuromorphic pixels to provide, for each neuromorphic pixel, an accumulated signal that represents radiations sensed by the neuromorphic pixel during the multiple reception periods.

The generating of the analog adder signal may include generating a positive pulse for a rising portion of each detection signal from each subpixel of the subpixels that may be expected to receive at least one received light pulse during the reception period. and generating a negative pulse for a falling portion of each detection signal from each subpixel of the subpixels that may be expected to receive at least one received light pulse during the reception period.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

A reduction of the influence of the ambient light can be attempted by several ways:
  a. Spectral filter at the receiver (to pass just the wavelengths in the spectral vicinity of the used LASER)
  b. Spatially non-uniform illumination to concentrate the light power of the LASER on only a portion of the scene.
  c. Spatial non-uniformity of the receiver (imager) sensitivity that adapts to the illumination pattern (this is one of the main claims of the present invention).

Other issues that need to be addressed by the system are:
  a. Coexistence of several LIDAR systems in the same scene
  b. Adverse atmospheric conditions such as rain, fog, snow
  c. Specular reflections that can deflect the laser beam (in which case no reflection is detected) or return the laser beam to the receiver at high intensity causing saturation.

There is provided a LIDAR system that uses a patterned illuminator and a specialized CMOS imager array.

Figure 1:
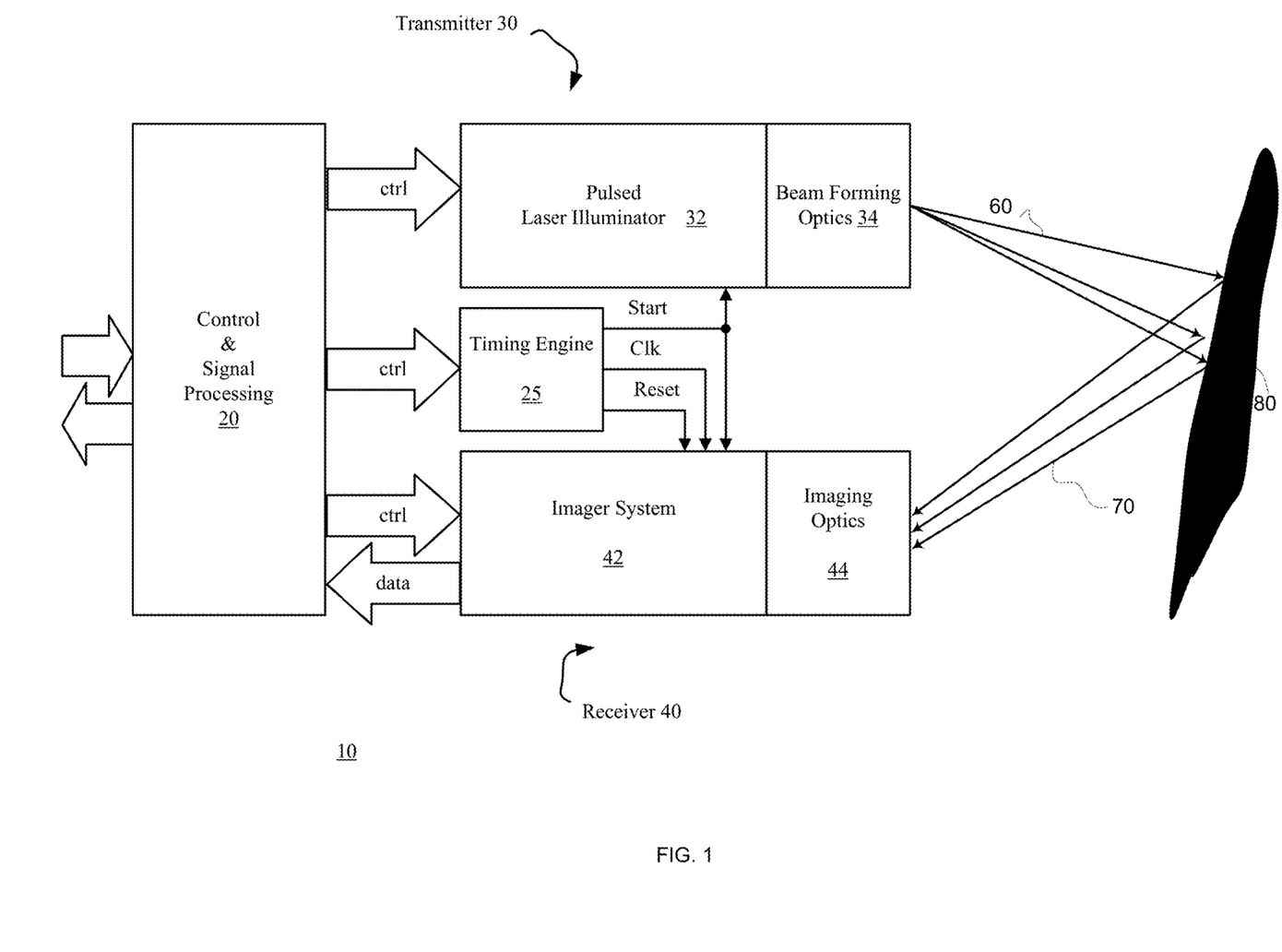
FIG. 1 is an example of a LIDAR system.

FIG. 1 illustrates an example of LIDAR system 10.

LIDAR system 10 include a control and signal processing unit 20, transmitter 30 and receiver 40.

The control and signal processing unit 20 coordinates the operation of the LIDAR system and computes the scene model that is delivered in the form of a point cloud or in any other manner.

The control and signal processing unit 20 may include a separate controller for controlling the LIDAR system and a separate signal processor for performing signal processing—but this is not necessarily so. The control and signal processing unit may include one or more integrated circuits.

The transmitter is configured to illuminate a space (or scene) in front of the LIDAR system with a light pattern. The light pattern may be formed from one or more laser pulses from the pulsed laser illuminator 32 and shaped by the beam forming optics 34.

The scene is illuminated by the pulsed laser. The beam forming optics take care of generating the desired spatial distribution of the illuminant power.

The receiver 40 includes imaging optics 44 that are followed by an imager system 42.

The imaging optics 42 projects the scene on the imaging system 42 that besides the angular position (determined by the location of a pixel in the imaging array) acquires depth information too by measuring the delay between the transmitted laser pulses 60 and the received light pulses 70.

The coordination of the transmitted pulses and receiver aperture slots is performed by the timing engine 25.

FIG. 1 also illustrates a timing engine 25 for sending clock signal, start signal and reset signal, data that is sent from the receiver 40 to the control and signal processing unit 20 and control signals sent from the control and signal processing unit 20 to the receiver 40 and the transmitter. Commands and/or processed data may be exchanged between the control and signal processing unit 20 and another device or system. Any other signals may be exchanged between LIDAR system and other systems and/or devices.

In FIG. 1 a single target 80 is illuminated by the pattern. There may be more than one target, no target and any other combination of targets.

Figure 2:
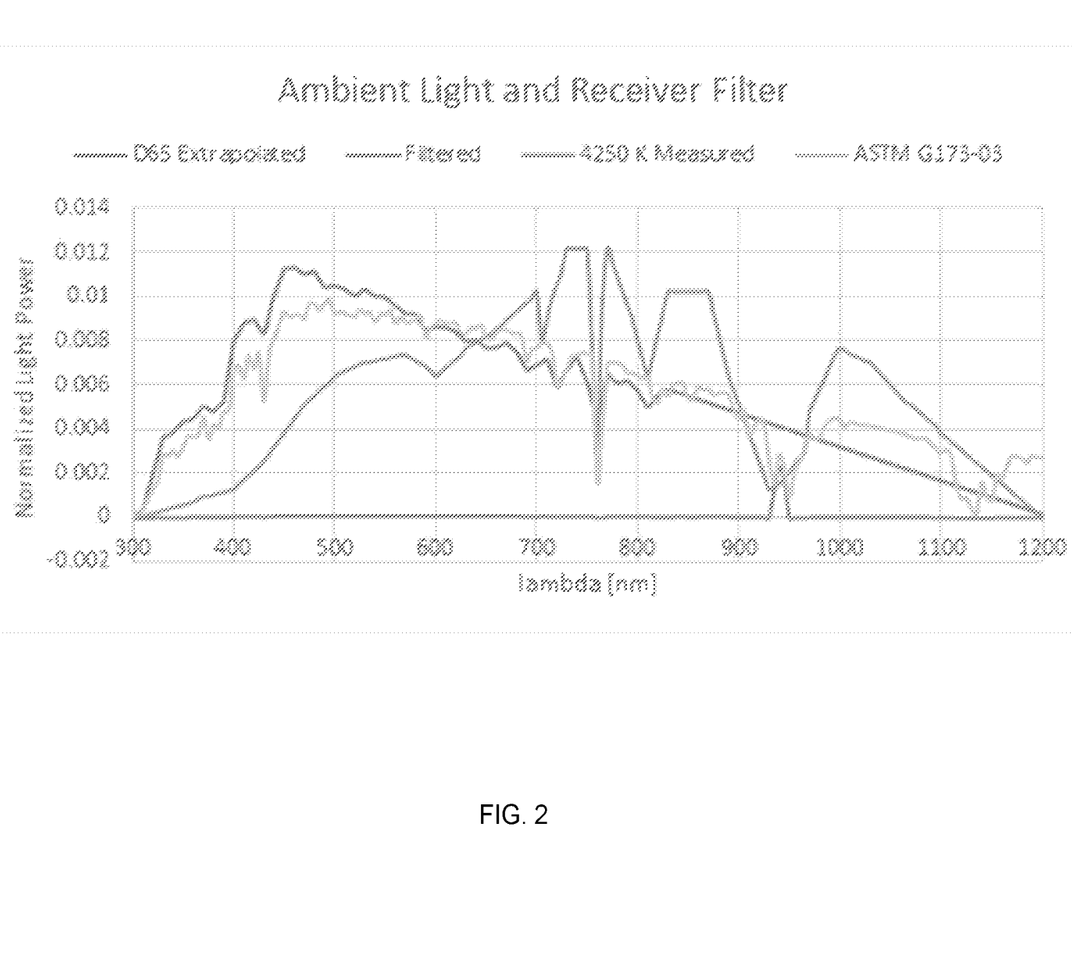
FIG. 2 is an example of a spectrum.

The spectrum of ambient light (sunlight) is presented in FIG. 2. The LIDAR system may transmit light pulses at a wavelength of 940 nm in order to benefit from the dip caused by atmospheric absorption. The receiver may include a receive filter that has a pass-band that is 20 nm wide (centered on 940 nm) and a 40 dB attenuation outside the passband.

Other wavelengths and other bandwidths can be used by the LIDAR system.

Figure 3:
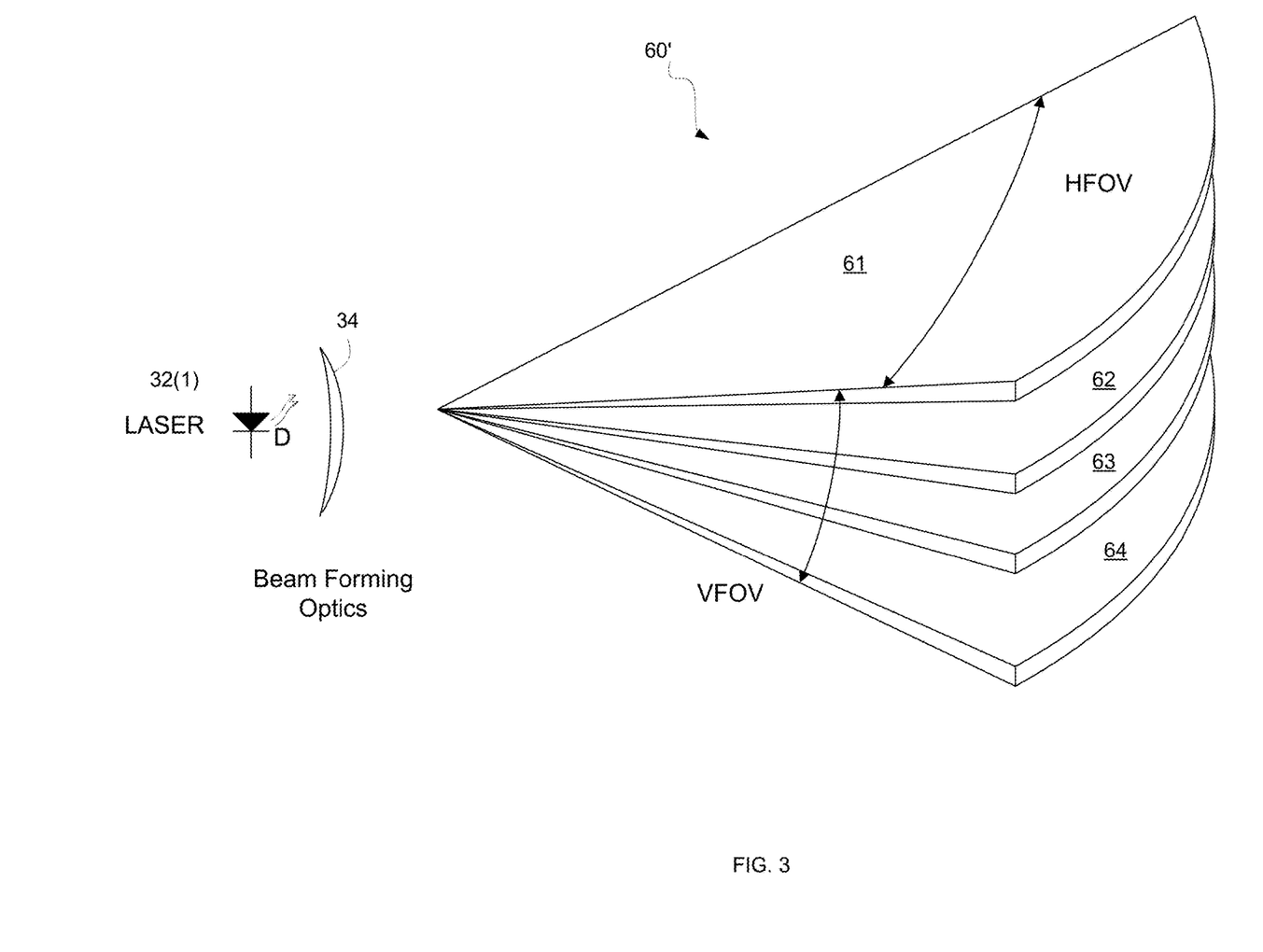
FIG. 3 is an example of a laser diode, beam forming optics and an illumination pattern.

FIG. 3 illustrates a pattern 60' that is sparse and include four vertical slices 61, 62, 63 and 64 that are spaced apart from each other. The area of the gaps between the four vertical slices has an overall area that may exceed and even well exceed the aggregate areas of the four vertical slices. Any spatial relationship may be provided between illuminated regions and non-illuminated regions.

In FIG. 3 the pattern 60' is generated by a single laser diode 32(1) and beam forming optics.

It should be noted that any pattern of light may be transmitted by the LIDAR system—especially a sparse pattern that covers a small part (for example less than 20 percent) of the field of view of the LIDAR system.

The gap (of angular pitch) between adjacent vertical slices may be approximatively equal (difference up to 20%) to a vertical resolution of the imager (vertical pixel pitch).

It is assumed at this point that the illuminator is aligned with the imager sensor so that the projected pattern does not suffer from parallax shifts or at least parallax effects are kept at a minimum.

The parallax effect anyway diminishes with object distance so that for objects far enough it becomes negligible.

Alternately, the LIDAR system may be configured to perform pattern adaptation/calibration for the long range and use a non-patterned uniform (diffuse) weaker laser for the short range operation.

Various other geometries can be used for pattern—such as vertical bands or even randomly placed patches.

Figure 4:
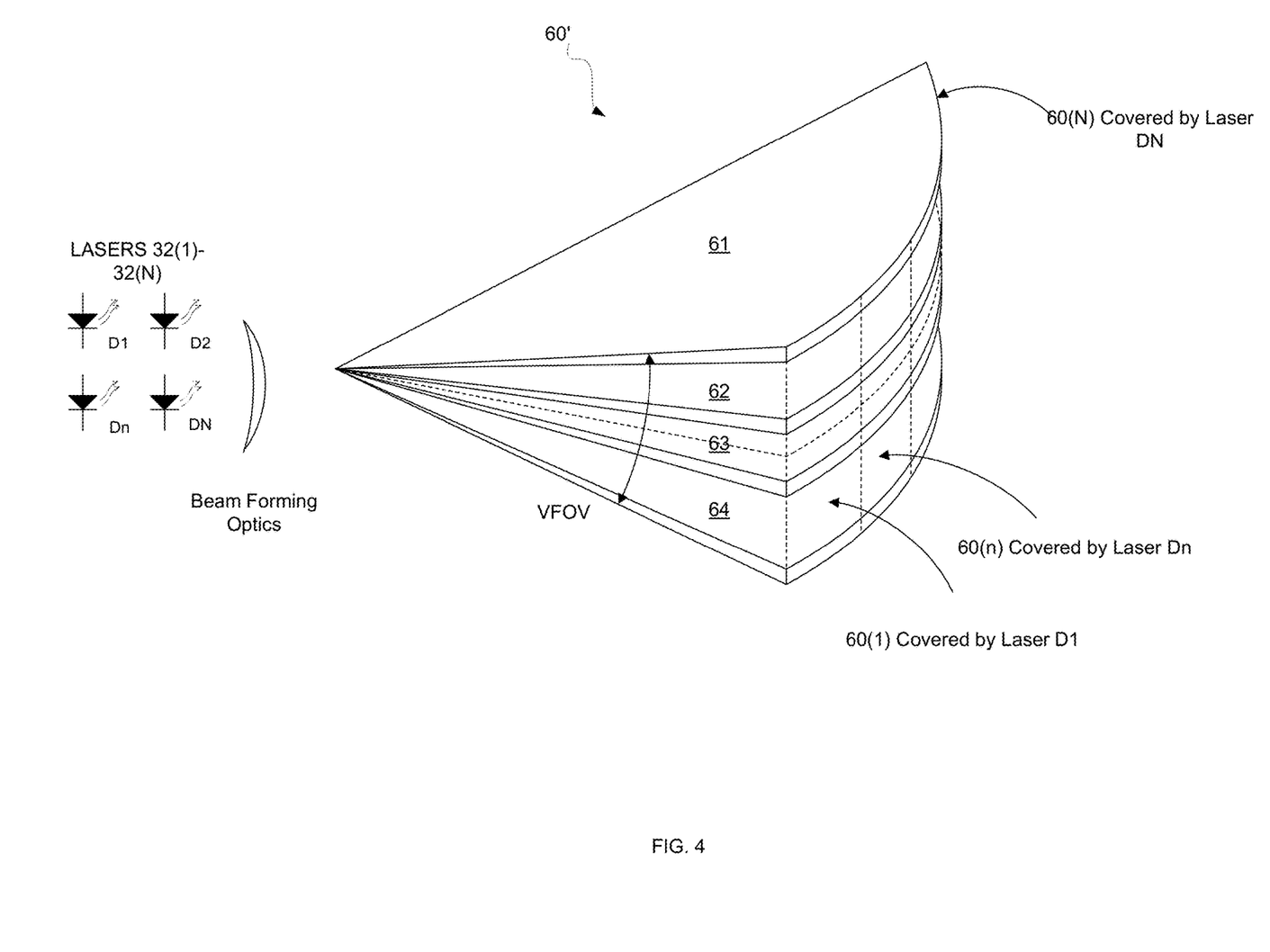
FIG. 4 is an example of laser diodes, beam forming optics and an illumination pattern that is virtually segmented to patches.

As the high power pulsed lasers usually come with an operating duty cycle limitation that is below the desired pulse rate, the LIDAR system may use several laser diodes operated sequentially each covering a portion of the total field of view as shown in FIG. 4. Multiple (N) laser diodes—D1-DN are allocated to different parts of the pattern so that after passing beam forming optics 34—light from laser diodes D1-DN cover patches 60(1)-60 (N). For index n between 1 and N the n'th laser diode Dn covers patch 60($n$).

The geometry of the regions covered by each of the lasers can be arbitrary, various patch patterns with or without partial overlaps are possible.

The transmitter may include a combined illuminator formed by the superposition of a low power uniform flash illuminator and a high power patterned illuminator as the ones described above. At short object distance the uniform illuminator is used with the advantage of avoiding saturating the sensor, at large distance the high power patterned illuminator helps achieving a better signal to noise ratio.

Figure 5:
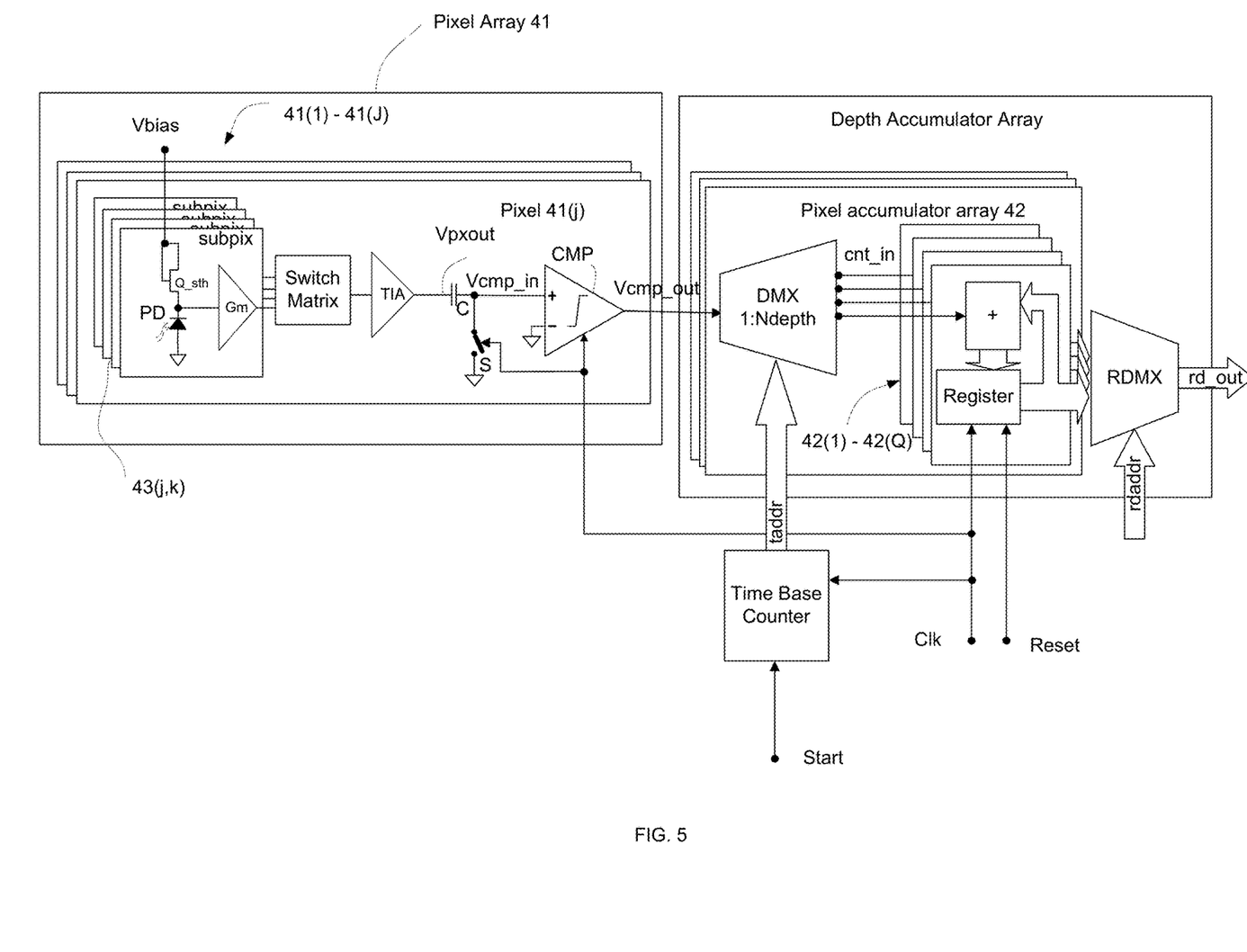
FIG. 5 is an example of pixels and a depth accumulator array of a receiver.

FIG. 5 illustrates an example of imager system 42.

Imager system 42 includes neuromorphic pixels 41(1)-41 (J) that may form pixels array 41. J being a positive integer that exceeds two. The q'th pixel (41($q$)) is illustrated as including a plurality (K) subpixels, each subpixel includes a photodiode (PD) biased by a non-linear (for example logarithmic) element (see transistor Q that is fed by bias signal Vbias), and an amplifier stage (Gm) (that acts as transconductor amplifier).

The non-linear element can be a diode connected MOS_FET in sub-threshold region or a different biasing solution that exhibits similar characteristic.

The biasing scheme might include an auto-zero mechanism that compensates device and circuit mismatch as well as control signal and/or supply variations across the pixel array.

The biasing scheme may also include means for providing a non-zero minimal photo-diode bias current during integration and auto-zero phases to ensure correct operation under dark conditions.

The sub-pixel outputs can selectively be selectively fed by a switch matrix to an analog adder that may be implemented as a transimpedance amplifier TIA that sums the output currents of the Gm sub-pixel stages selected by the switch matrix. The pixel outputs is fed to the sampling circuit formed by capacitor C and switch S. The operating sequence of the sampling circuit is described in FIG. 6.

Figure 6:
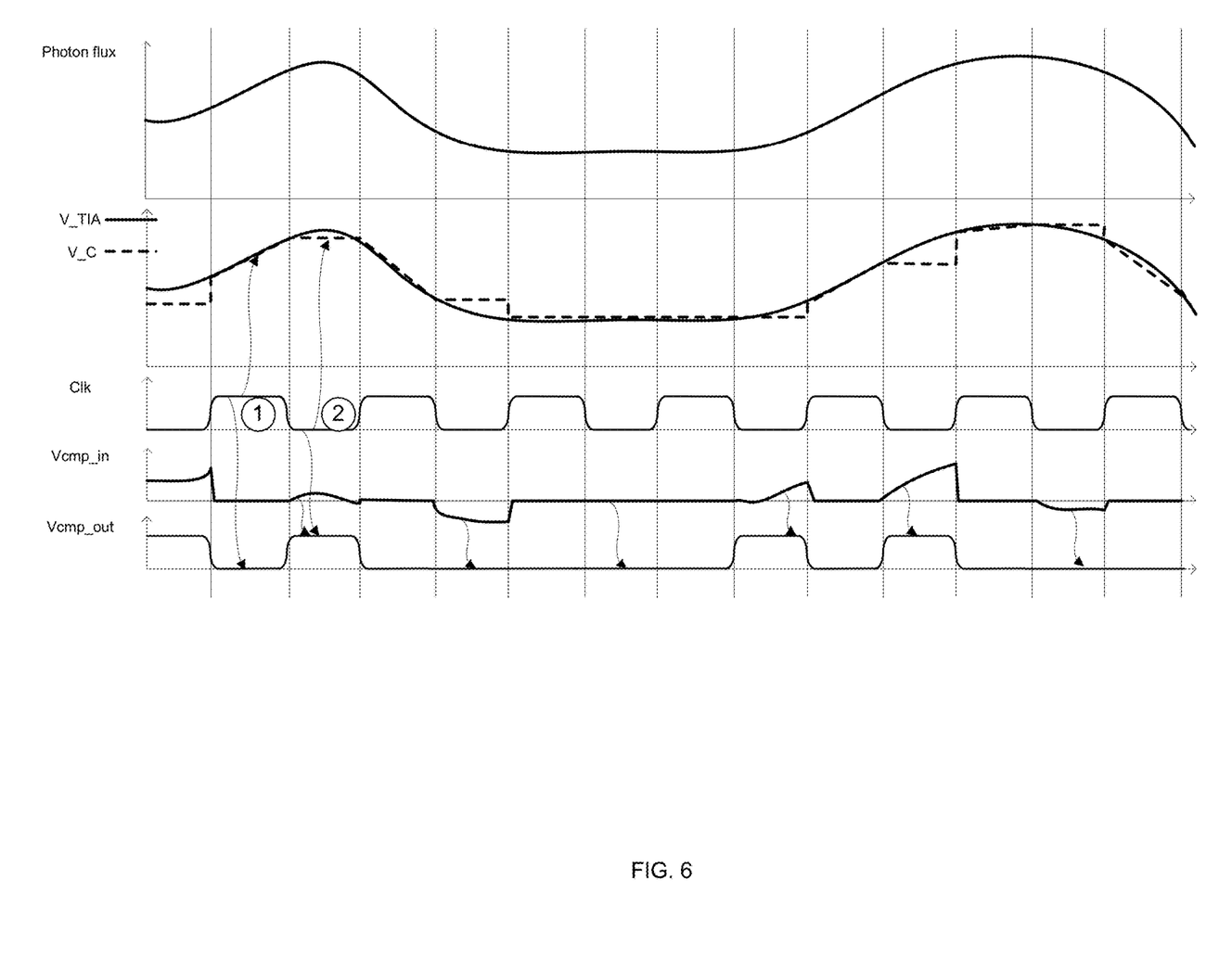
FIG. 6 is an example of waveforms related to the operation of a pixel.

This type of sampling circuit generates waveform Vcmp_in that has positive pulses for the rising portions of the Vpxout (VTIA) signal and negative pulses for the falling portions, implementing in this fashion a differentiator circuit. The advantage of using this differentiator circuit is that it rejects the constant background illumination (as for constant input no pulses are generated by the comparator except for the pulses created by the noise component). The output of the sampling circuit is fed to clocked comparator CMP. The comparator outputs a pulse for each clock cycle in which its input signal is above a threshold. If the threshold=zero then the pulse is generated when the input signal is positive. If the input signal is negative, no pulse is generated by the comparator. This behavior is similar to the operation of a neuron.

The output Vcmp_out of each pixel is fed to a pixel accumulator array. The pixel accumulator array 42 may include a de-multiplexer DMX (1:Ndepth) that receives an address from a central time base counter. Depending on the value of the time base counter, the de-multiplexer routes the pixel output to one out of Ndepth accumulator circuits. The accumulator circuit increments the register value if the comparator generated a pulse and leaves it unchanged otherwise. The accumulators can be implemented either as digital circuits or as analog integrators.

The content of the accumulator arrays is read out via RDMX. If the accumulators are implemented as digital circuits, RDMX is a memory readout circuit. If the accumulators are implemented as analog circuits, the RDMX is a structure similar to the readout circuit of a conventional image sensor.

In case the illuminator is built in a fashion that combines several diode lasers that are operated in a time interleaved fashion, the size of the accumulator array may or may not be reduced so that it is used as a shared resource (as it needs to keep only the data from the region illuminated by a single LASER).

The acquisition cycle may be executed as follows:
a. At start, the time base counter is set to zero and the laser emits the light pulse
b. Each following clock cycle, the time base counter is incremented and the comparator pulse will be registered in the accumulator corresponding to the time base counter value.
c. When all the Ndepth accumulators have been addressed, the cycle is complete, the time base can now be reset and a new cycle started.

After a predefined number of acquisition cycles (sufficient to average out the noise)—that form a time window, the accumulator array will contain a digitized waveform that is an approximation of the shape of the received pulse. Due to the fact that the output of the comparator is quantized (single bit), the output signal (of the accumulators) is compressed permitting this way accommodating a large dynamic range (so as no saturation occurs at strong signals reflected from near targets).

In the signal processing block, the raw data from the accumulator array is used to compute the point cloud that is the output of the system. It is important to evaluate the probabilities of false points and missing points in the cloud. These probabilities can be improved if one applies a majority vote over several captures or similar strategies.

Figure 7:
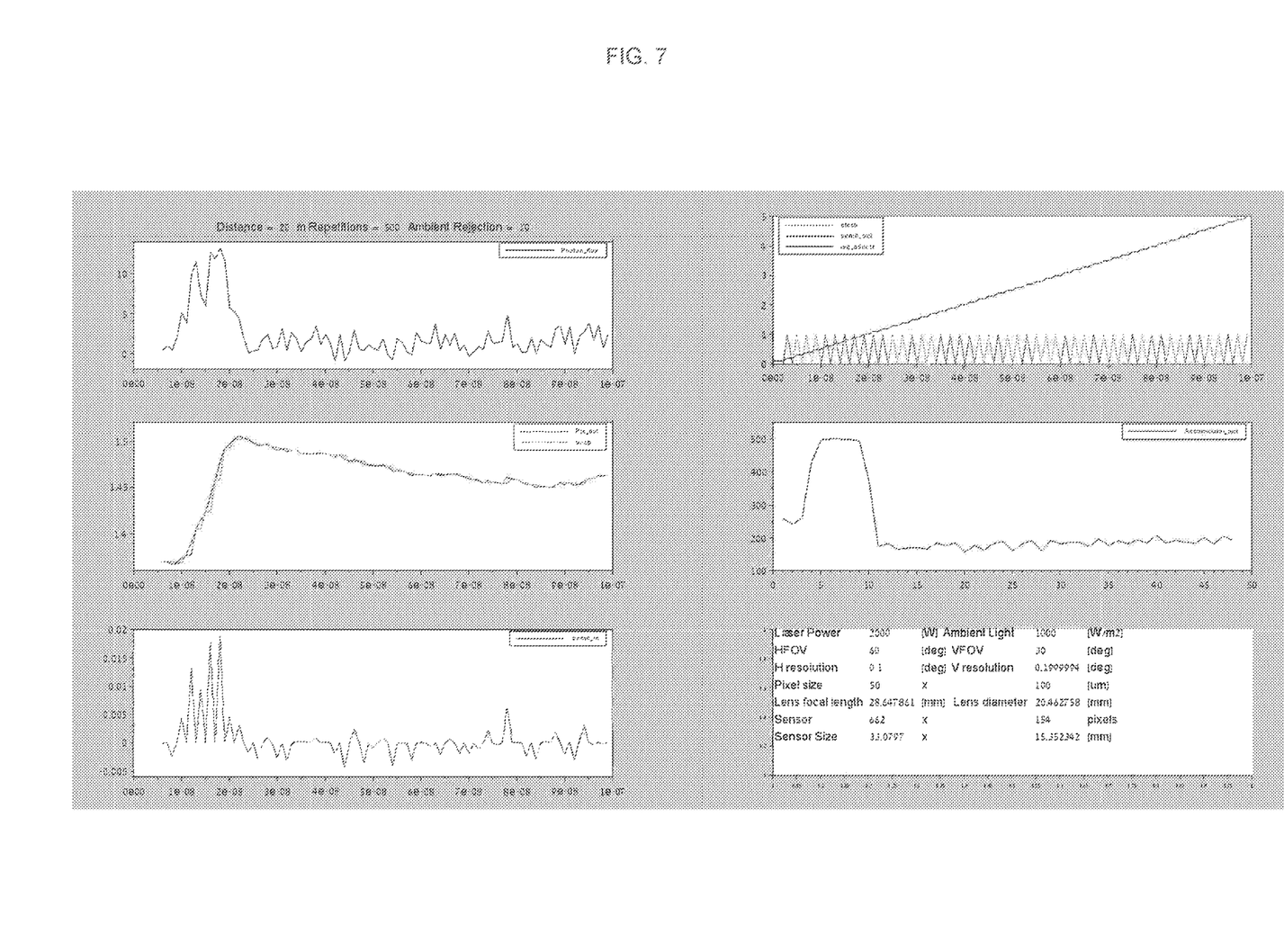
FIG. 7 is an example of various waveforms.

A set of simulated waveforms is presented in FIG. 7. Subplot 111 represents the photon flux incident on a given pixel. Subplot 112 represents the pixel output voltage Vpxout (VTIA) and the voltage on the sampling capacitor C. Subplot 113 represents the voltage at the input of the comparator. Subplot 114 represents the clock signal, the comparator output and the de-multiplexer address (output of time base counter). Subplot 115 represents the averaged content of the register that is read out at the end of the measurement. Subplot 116 contains a description of the radiometric parameters used to define the given simulation.

Figure 8:
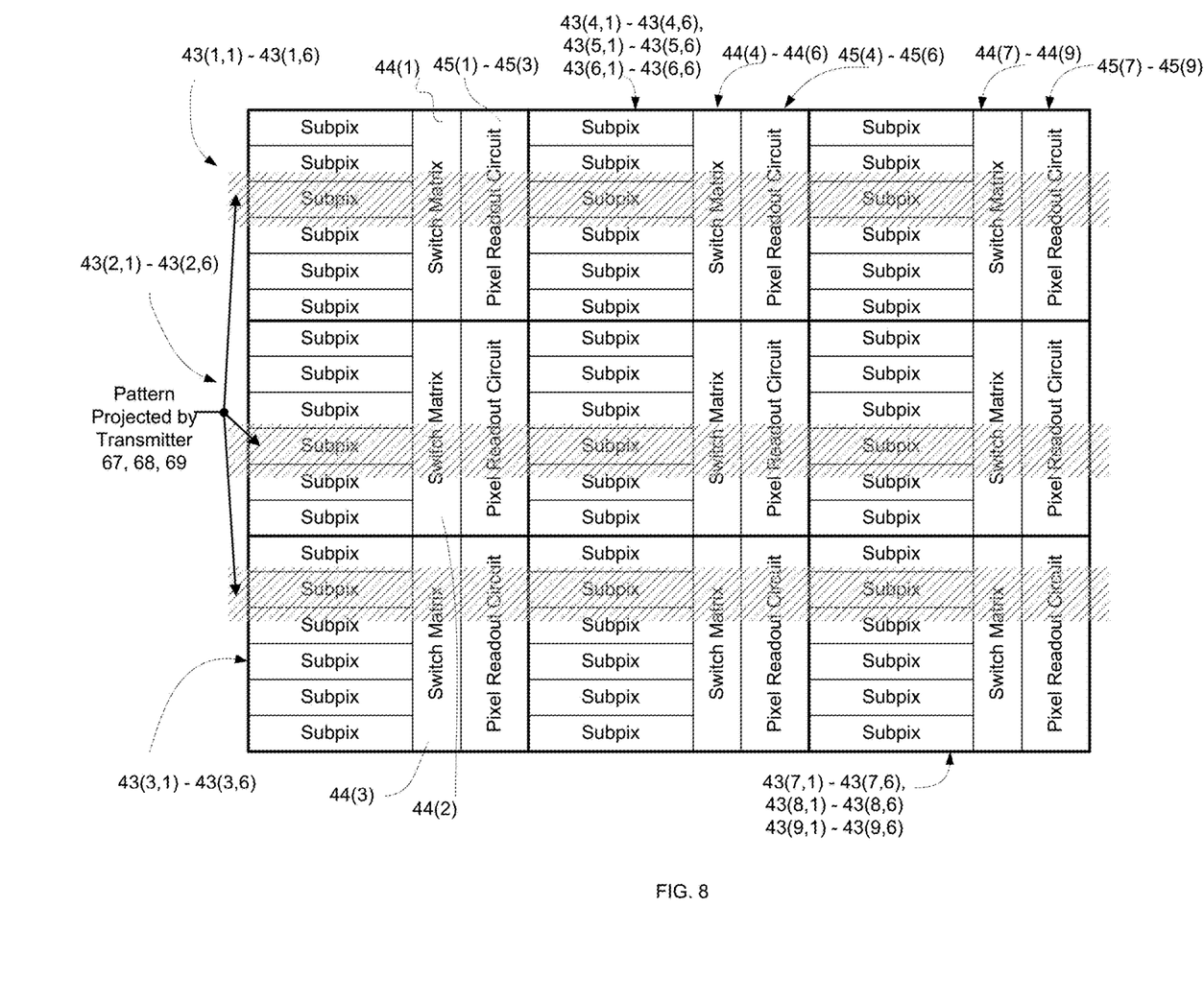
FIG. 8 is an example of pixels and reflected light beams; and subdivision of pixels to subpixels.

FIG. 8 presents an example of nine pixels, each pixels include a sequence of subpixels ("subpix"). The pattern projected by the illuminator (in this case for the arrangement shown in FIG. 3) will fall on only part of the subpixels. By disabling (or otherwise ignoring) the subpixels that are not illuminated, the LIDAR system eliminates their noise contribution and thus we can improve the signal to noise ratio and so increase the range of the LIDAR First pixel includes subpixels 43(1,1)-43(1,6).
Second pixel includes subpixels 43(2,1)-43(2,6).
Third pixel includes subpixels 43(3,1)-43(3,6).
Fourth pixel includes subpixels 43(4,1)-43(4,6).
Fifth pixel includes subpixels 43(5,1)-43(5,6).
Sixth pixel includes subpixels 43(6,1)-43(6,6).
Seventh pixel includes subpixels 43(7,1)-43(7,6).
Eighth pixel includes subpixels 43(8,1)-43(8,6).
Ninth pixel includes subpixels 43(9,1)-43(9,6).

The first till ninth pixels are followed by first till ninth switch matrices 44(4)-44(9) that in turn are followed by pixel readout circuits 45(1)-45(9).

In FIG. 8 subpixels 43(1,3), 43(4,3) and 43(7,3) are illuminated by a first stripe 67 of a received pattern, subpixels 43(2,4), 43(5,4) and 43(8,4) are illuminated by a second stripe 68 of the received light pattern, and subpixels 43(3,2), 43(6,2) and 43(9,2) are illuminated by a third stripe 69 of the received light pattern. The LIDAR system may read the outputs of these sub-pixels. Other sub-pixels that are not substantially exposed to any stripe of the received light pattern may be deactivated or ignore off.

Figure 9:
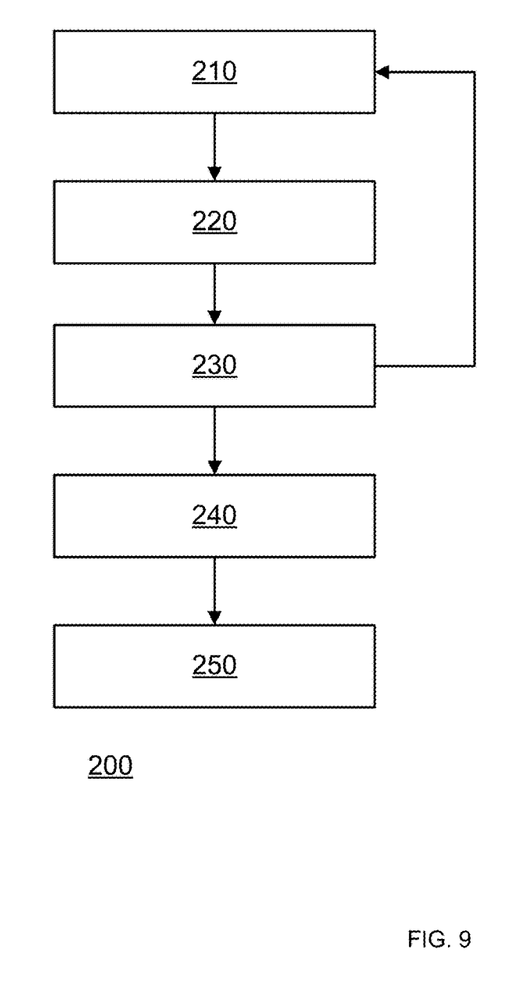
FIG. 9 is an example a method.

FIG. 9 illustrates method 200.

Method 200 may include detecting one or more targets using a LIDAR system.

Method 200 may start by step 210 of outputting, by a transmitter of the LIDAR system, during an illumination period, one or more laser pulses that form a sparse pattern. The transmitter may include a pulsed laser illuminator that is followed by a beam forming optics.

Step 210 may be followed by step 220 of receiving, by a receiver of the LIDAR system, during a reception period, one or more received light pulses from one or more objects that were illuminated by the one or more laser pulses transmitted during each illumination period. The receiver may include an array of neuromorphic pixels and multiple accumulators. Each neuromorphic pixel may include multiple subpixels, an analog adder and a comparator.

Step 220 may be followed by step 230 of generating an analog adder signal, by each analog adder, by adding detection signals from subpixels that are expected to receive at least one received light pulse during the reception period. Wherein for each reception period the analog adder signal is indifferent to subpixels that are not expected to receive any received light pulses during the reception period.

Step 230 may be followed by step 240 of providing a pixel output signal, by each comparator, by comparing the analog adder signal to a threshold.

Steps 210-240 may be repeated multiple times (for multiple reception periods and multiple illumination periods).

There multiple repetitions may be followed by step 250 of adding, by multiple accumulators of the LIDAR system, multiple pixel output signals from neuromorphic pixels to provide, for each neuromorphic pixel, an accumulated signal that represents radiations sensed by the neuromorphic pixel during the multiple reception periods.

The multiple repetitions may be required to reduce random noise and improve the signal to noise ratio of the accumulated signal.

Step 250 may be followed by processing at least the accumulated signals from multiple pixels to detect targets, estimate the distance to the targets and the like.

It should be noted that the laser diodes may be replaced by any other laser sources.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Any reference to any of the terms "comprise", "comprises", "comprising" "including", "may include" and "includes" may be applied to any of the terms "consists", "consisting", "consisting essentially of". For example—any of the circuits illustrated in any figure may include more components that those illustrated in the figure, only the components illustrated in the figure or substantially only the components illustrate din the figure.

Also for example, in one embodiment, the illustrated examples may be implemented as circuitry located on a single integrated circuit. Alternatively, the examples may be implemented as any number of separate integrated circuits or separate common mode noise chokes interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A LIDAR system comprising:
a transmitter; and
a receiver;
wherein the transmitter comprises a pulsed laser illuminator that is followed by a beam forming optics;
wherein the transmitter is configured to output, during each illumination period of multiple illumination periods, one or more laser pulses that form a sparse pattern;
wherein the receiver is configured to receive, during each reception period of multiple reception periods, one or more received light pulses from one or more objects that were illuminated by the one or more laser pulses transmitted during each illumination period;
wherein the receiver comprises an array of neuromorphic pixels and multiple accumulators;
wherein each neuromorphic pixel comprises multiple subpixels, an analog adder and a comparator; wherein for each reception period the analog adder is configured to generate an analog adder signal by adding detection signals from subpixels that are expected to receive at least one received light pulse during the reception period; wherein for each reception period the analog adder signal is indifferent to subpixels that are not expected to receive any received light pulses during the reception period; and wherein the comparator is configured to provide pixel output signals by comparing the analog adder signal to a threshold; and
wherein the multiple accumulators are configured to add multiple pixel output signals from neuromorphic pixels to provide, for each neuromorphic pixel, an accumulated signal that represents radiations sensed by the neuromorphic pixel during the multiple reception periods.

2. The LIDAR system according to claim 1 wherein the transmitter is configured to output, at a certain point in time of each illumination period, the one or more laser pulses that form the sparse pattern.

3. The LIDAR system according to claim 2, wherein for each reception period, each neuromorphic pixel is configured to deactivate the subpixels that are not expected to receive any received light pulse during the reception period.

4. The LIDAR system according to claim 2, wherein for each reception period, the analog adder of each neuromorphic pixel is configured to ignore signals outputted from subpixels that are not expected to receive any received light pulse during the reception period.

5. The LIDAR system according to claim 1 wherein the transmitter is configured to output, at different points in time during each illumination period, different laser pulses that form the sparse pattern.

6. The LIDAR system according to claim 5, wherein for each reception period and for each point in time of the different points in time, each neuromorphic pixel is configured to deactivate the subpixels that are not expected to receive any received light pulse during the point in time of the different points in time.

7. The LIDAR system according to claim 5, wherein for each reception period and for each point in time of the different points in time, the analog adder of each neuromorphic pixel is configured to ignore signals outputted from subpixels that are not expected to receive any received light pulse during the point in time of the different points in time.

8. The LIDAR system according to claim 5, wherein the transmitter comprises multiple laser diodes that are configured to output at different points in time of each illumination period, different laser pulses that form the sparse pattern.

9. The LIDAR system according to claim 8, wherein different laser diodes are configured to output different parts of the sparse pattern.

10. The LIDAR system according to claim 1, wherein the sparse pattern comprises multiple lines that are spaced apart from each other; wherein an aggregate size of the sparse pattern is a fraction of a field of view of the receiver.

11. The LIDAR system according to claim 1, wherein each subpixel comprises a photodiode biased by a non-linear element, and a charge amplifier.

12. The LIDAR system according to claim 11, wherein the the non-linear element is a diode connected MOS_FET in sub-threshold region.

13. The LIDAR system according to claim 11, wherein the the non-linear element comprises an auto-zero mechanism that compensates at least one out of device mismatches, circuit mismatches, s control signal variation across the pixels and supply variations across the pixels.

14. The LIDAR system according to claim 11, wherein the non-linear element is configured to provide non-zero minimal photo-diode bias current during integration and auto-zero phases of the photo-diode.

15. The LIDAR system according to claim 1, wherein each subpixel comprises a photodiode biased by a non-linear element, and a trans conductor amplifier.

16. The LIDAR system according to claim 1 wherein the analog adder of each neuromorphic pixel is configured to (i) generate a positive pulse for a rising portion of each detection signal from each subpixel of the subpixels that are expected to receive at least one received light pulse during the reception period; and (ii) generate a negative pulse for a falling portion of each detection signal from each subpixel of the subpixels that are expected to receive at least one received light pulse during the reception period.

17. A method for detecting one or more targets using a LIDAR system, the method comprises:
   outputting, by a transmitter of the LIDAR system, during each illumination period of multiple illumination periods, one or more laser pulses that form a sparse pattern;
   wherein the transmitter comprises a pulsed laser illuminator that is followed by a beam forming optics;
   receiving, by a receiver of the LIDAR system, during each reception period of multiple reception periods, one or more received light pulses from one or more objects that were illuminated by the one or more laser pulses transmitted during each illumination period; wherein the receiver comprises an array of neuromorphic pixels and multiple accumulators;
   wherein each neuromorphic pixel comprises multiple subpixels, an analog adder and a comparator;
   generating an analog adder signal, for each reception period and by each analog adder, by adding detection signals from subpixels that are expected to receive at least one received light pulse during the reception period; wherein for each reception period the analog adder signal is indifferent to subpixels that are not expected to receive any received light pulses during the reception period;
   providing pixel output signal, by each comparator and for each reception period, by comparing the analog adder signal to a threshold; and
   adding, by multiple accumulators of the LIDAR system, multiple pixel output signals from neuromorphic pixels to provide, for each neuromorphic pixel, an accumulated signal that represents radiations sensed by the neuromorphic pixel during the multiple reception periods.

18. The method according to claim 17 the generating of the analog adder signal comprises generating a positive pulse for a rising portion of each detection signal from each subpixel of the subpixels that are expected to receive at least one received light pulse during the reception period; and generating a negative pulse for a falling portion of each detection signal from each subpixel of the subpixels that are expected to receive at least one received light pulse during the reception period.

* * * * *